United States Patent [19]
Franks et al.

[11] 4,296,319
[45] Oct. 20, 1981

[54] WAVEFORM SYNTHESIZER

[75] Inventors: Larry A. Franks; Melvin A. Nelson, both of Santa Barbara, Calif.

[73] Assignee: The United States of America as represented by the United States Department of Energy, Washington, D.C.

[21] Appl. No.: 101,369

[22] Filed: Dec. 7, 1979

[51] Int. Cl.³ .............................................. G02B 5/14
[52] U.S. Cl. ................... 250/227; 350/96.15; 455/612
[58] Field of Search ............ 250/227; 350/96.15, 350/96.24; 455/610, 612

[56] References Cited
U.S. PATENT DOCUMENTS

| | | |
|---|---|---|
| 3,600,594 | 12/1968 | Moore . |
| 3,684,346 | 8/1972 | Lang ............................ 350/96.24 |
| 3,867,627 | 2/1975 | Nelson et al. . |
| 3,892,468 | 7/1975 | Duguay ........................ 250/227 X |
| 3,980,391 | 4/1975 | Stewart . |
| 3,991,318 | 11/1976 | Duguay . |
| 4,128,759 | 12/1978 | Hunt et al. ................ 350/96.15 X |
| 4,164,373 | 8/1979 | Schuss et al. ................. 250/227 X |

*Primary Examiner*—David C. Nelms
*Assistant Examiner*—Edward P. Westin
*Attorney, Agent, or Firm*—John A. Koch; Richard G. Besha; James E. Denny

[57] ABSTRACT

A method of producing optical and electrical pulses of desired shape. An optical pulse of arbitrary but defined shape illuminates one end of an array of optical fiber waveguides of differing lengths to time differentiate the input pulse. The optical outputs at the other end of the array are combined to form a synthesized pulse of desired shape.

10 Claims, 3 Drawing Figures

WAVEFORM SYNTHESIZER

BACKGROUND OF THE INVENTION

This invention relates to a method of producing waveforms of desired shape and more particularly to a system for obtaining output waveforms of selected shape through the transformation of readily available optical input pulses.

There are many applications for systems capable of producing specific optical or electrical waveforms. Generally, in the design and testing of optical or electro-optical devices, it is necessary to measure the ability of the device to follow the input optical waveform or alternately to measure the distortion in the waveform introduced by the device. Since it is often necessary to test the response of the device to a range of input optical waveforms (e.g., various rise and decay times), a waveform generator capable of variable outputs is particularly desirable. Similarly, electrical waveforms are utilized to measure the response of circuits to known inputs. In particular, in nuclear explosives diagnostics where pulse shapes are well documented but not normally available, both simulated electrical and optical waveforms are valuable in testing circuitry as well as data handling systems.

Prior techniques for synthesizing pulses of desired shape are presently quite limited, particularly for pulse widths less than about 1 usec. Prior techniques for generating specially shaped electrical pulses have generally used resistive-capacitive networks which use diodes, transistors, or other active elements. These generally produce pulse shapes which have undesirable variations in rate of voltage change, have limited dynamic range, and are not highly reproducible. Transmission lines have also been used to shape pulses, primarily by storing energy in a coaxial line which is switched into a load by a fast switch. Pulses produced in this way are frequently accompanied by additional unwanted pulses caused by unavoidable reflections at the transmission line impedance mismatches. Synthesis of electrical pulse shapes using multiple electrical source generators is also generally unsatisfactory due to the impedance matching problem.

Optical pulses have frequently been shaped by the use of mechanical shutters, rotating apertures, or mirrors. However, these approaches have not been very successful in shaping pulses with pulse widths less than about 1 usec. Optical pulse shaping techniques in the 1 –10 ns range have been limited mainly to electro-optical devices whose transfer functions are either fixed or confined to a narrow range. Some shaping of the output of optical sources, such as lasers and flash lamps, is possible through alterations in the energy transfer circuitry, but this is limited to rather narrow regions.

The invention is a method by which an optical pulse of an arbitrary but defined shape may be transformed into a virtual multitude of optical or electrical output pulse shapes. Since the method is not limited to any particular input pulse shape, the output pulse shapes that can be generated thereby are virtually unlimited. Moreover, output pulse widths as narrow as about 0.1 nsec can be readily obtained since optical pulses of less than a few picoseconds are available for use as driving pulses. The range of output pulse widths obtainable is very large, the limiting factors being the driving source energy and the particular shape of the desired output pulse.

BRIEF SUMMARY OF THE INVENTION

Accordingly, it is an object of the invention to provide a method for producing variable waveforms of selected shape. It is a further object of the invention to produce such output waveforms of selected shape by the transformation of an optical input pulse.

Briefly summarized, the above and additional objects are accomplished by illuminating one end of an array of optical fibers of preselected lengths by a single, narrow optical pulse, such as provided by a pulsed laser. The resultant output optical pulse at the other end of the array is the optical sum of a chain of pulses, each having a shape closely similar to the input pulse, but with reduced amplitude, and spaced apart in time by $\Delta t$ amounts proportional to the differential fiber lengths, $\Delta L$. The relationship between $\Delta L$ and $\Delta t$ is given by the equation $$\Delta L = \frac{c}{n} \Delta t$$

where n is the effective index of refraction for the fiber and c is the speed of light in a vacuum. Assuming a typical propagation velocity in the fiber, i.e., c/n, of $2 \times 10^{10}$ cm/sec, a delay of $5 \times 10^{-11}$ sec is available for each centimeter increment in length.

The shape of the envelope of the output pulse is controlled by adjusting the number and lengths of the fibers and, of course, the shape of the input pulse. The overall pulse width is determined by the extremes in fiber lengths. As will be more apparent hereinafter, any desired pulse shape that can be approximated by some manner of summation of an available input pulse shape may be generated by the method of the invention. The output optical pulse may be readily converted into an electrical pulse such as by a photodetector or photomultiplier.

While arrays of optical fibers have previously been utilized to divide an optical pulse into a plurality of time-differentiated output pulses such as for use as individual time-related sampling pulses in U.S. Pat. No. 3,867,627 to Melvin A. Nelson, Terence J. Davis, and John C. Clark, assignors to assignee of this application, and U.S. Pat. No. 3,991,318 to Michel Albert Duguay, and to compress or expand the width of an input pulse for purposes of pulse correlation and signal processing such as in U.S. Pat. No. 3,600,594 to John F. Moore, they have not heretofore been utilized in the generation of output pulses of entirely arbitrary but selected shape by the selective recombination of the portion of the input pulse transmitted by each individual optical fiber.

The above-mentioned and additional objects, advantages, and applications of the invention and a further understanding of the invention will be apparent after consideration of the following detailed description in conjunction with reference to the accompanying drawings.

DETAILED DESCRIPTION

Figure 1:
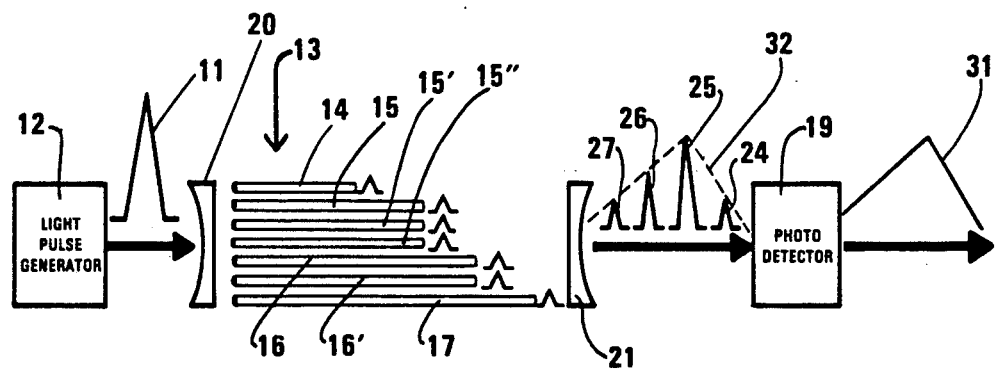
FIG. 1 is a schematic representation of a system 20 according to the invention.

Referring now to FIG. 1, an input light pulse 11 of arbitrary but defined shape generated by a suitable light-generating source 12 is made to illuminate one end of an array 13 of a plurality of indvidual optical fiber light guides. While the shape of input pulse 11 and the number and the lengths of individual fibers in array 13 will be determined by the particular output desired, as will be more apparent hereinafter, for purposes of illustration, array 13 is shown in FIG. 1 as including seven fibers, the first of which 14 is of a first length, three fibers 15, 15', and 15" of a second length, two fibers 16 and 16' of a third length, and a last fiber 17 of a fourth length.

Photodetector 19 is positioned to receive the outputs from the individual fibers of array 13. Lenses 20 and 21 may be utilized at either end of array 13 if desired. Photodetector 19 sees four optical pulses 24, 25, 26, and 27. Pulse 24 is the portion of original pulse 11 which was transmitted down fiber 14; pulse 25 is the sum of the three portions of pulse 11 which were transmitted down fibers 15, 15', and 15", and so on. Since fiber 14 is the shortest of the seven, pulse 24 is the first to arrive at photodetector 19, whereas pulse 27 arrives last since fiber 17 is the longest and pulses 25 and 26 arrive at intermediate times.

Electrical pulse output 31 of photodetector 19 will approach the shape of the envelope 32 which contains optical pulses 24, 25, 26, and 27. While the degree to which a particular photodetector 19 provides a smooth interpolation between the optical pulses actually seen is dependent upon the bandwidth of the detector and its associated circuitry, the number and differential lengths of the individual fibers making up a particular array 13 can be readily selected to provide the desired density, or closeness, of the optical pulses within envelope 32 to provide an electrical output pulse 31 of desired smoothness. Similar considerations would apply where the desired output is actually the optical output of array 13 approximating a pulse having a shape of envelope 32.

Figure 2:
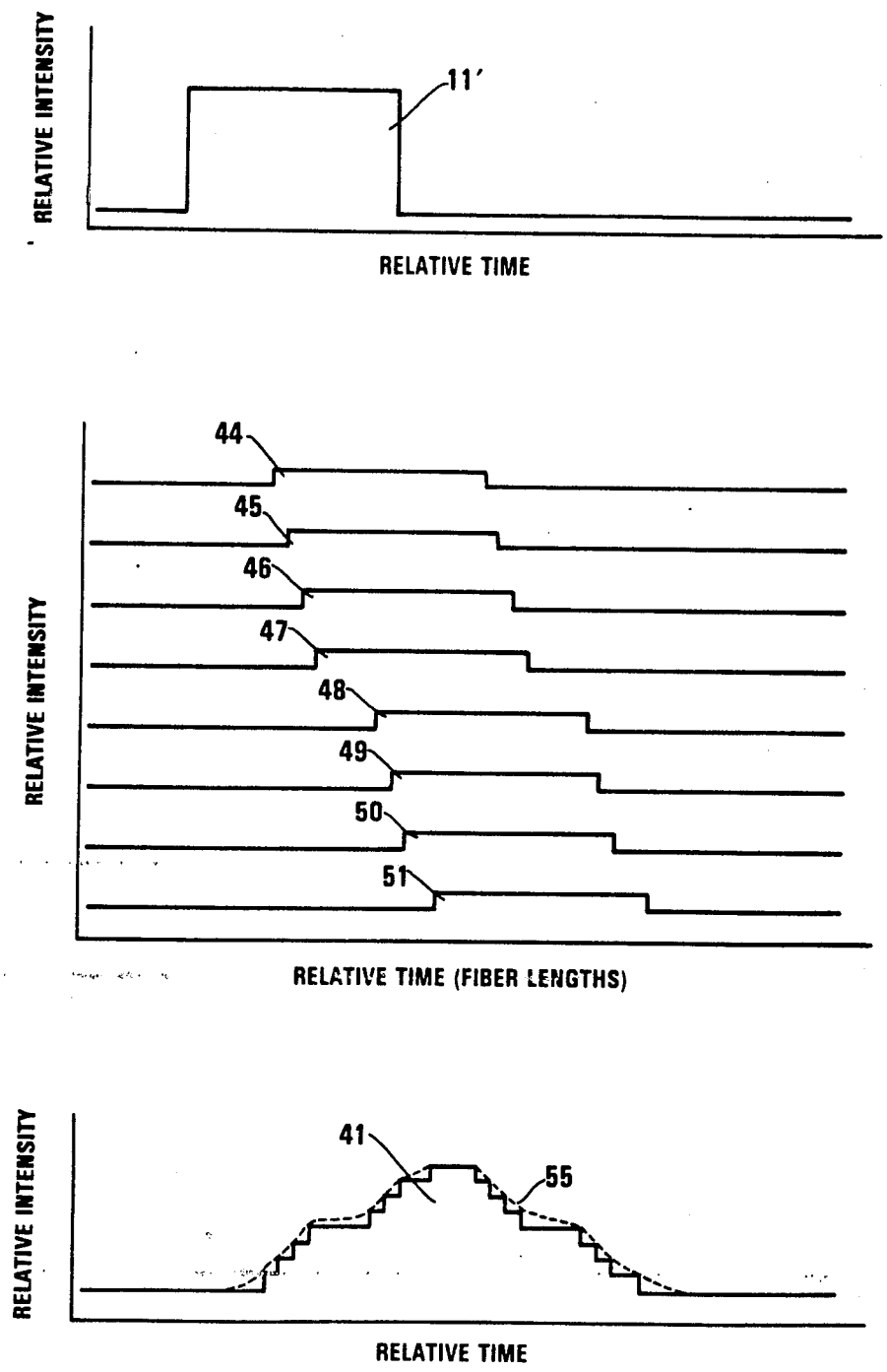
FIG. 2 illustrates an application of the invention utilizing a step function optical pulse input.

FIG. 2 illustrates how principles of the invention may be utilized to produce an optical or electrical pulse output 41 having desired pulse rise time utilizing the input of an optical step function pulse 11' of selected width. Output pulses 44 through 51 are produced by spreading step function pulse 11' over an array of fibers, not shown, which differs from the particular array 13 shown in FIG. 1 by being composed of fibers of successively increasing lengths. Assuming the array includes n fibers and the amplitude of pulse 11' is 1, each pulse 44–51 would be a step function pulse having an amplitude of 1/n and the width of input pulse 11'. Each would also be delayed in time in accordance with its differential length as previously stated. The output of the array, pulse 41, is a composite of pulses 44–51, and is contained within smooth-figured envelope 55 shown in dashed line.

The versatility of the invention can be appreciated from the example of FIG. 2. A large multitude of different output pulse shapes can be constructed from different combinations of the individual step function portions transmitted over individual fibers of the particular array of fibers utilized. Since any number of pulse shapes can be utilized as an input, the number of different output pulse shapes obtainable is truly enormous.

Figure 3:
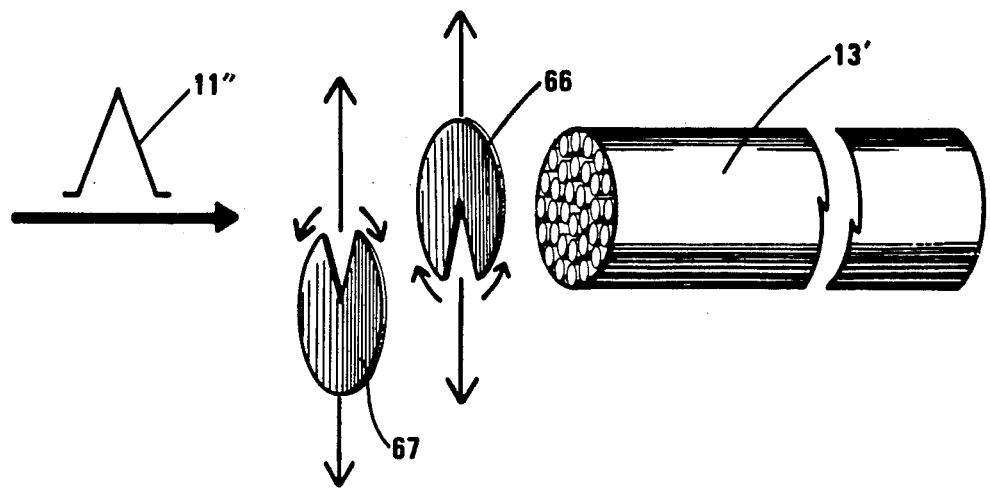
FIG. 3 illustrates another alternative embodiment of the invention.

FIG. 3 illustrates an embodiment of the invention providing a versatility of outputs from a single array 13'. Only a portion of the combination of apparatus utilized, previously discussed with reference to FIG. 1, is illustrated in FIG. 3. Array 13' includes a plurality of portions, each portion containing one or more fibers of a particular differential length. For instance, in a cylindrical array such as that shown in FIG. 3, one convenient arrangement would be for the fibers to be arranged in concentric rings with all the fibers at a given radius being the same length. The number of fibers in a given ring could be either proportional to the radius of the ring or varied to accommodate particular waveforms. Selection of the combination of fibers to be illuminated by light pulse 11" of selected shape would be accomplished by the use of opaque masks such as 66 and 67. Either a fixed mask, or masks, can be used to select the particular fibers in array 63 to be illuminated and unilluminated in order to produce a specific output envelope. The position of more universal masks, such as of the shape shown for 66 and 67, can be manipulated with respect to each other and the array in order to produce the spreading of the input over selected fibers of the combination of lengths necessary to obtain the desired output pulse. A multitude of particular combinations of differential lengths of fibers illuminated by particular input pulses to obtain output pulses of particular shape will readily occur to those skilled in the art.

While the fundamental novel features of the invention have been shown and described and pointed out as applied to particular embodiments by way of example, it will be appreciated by those skilled in the art that various omissions, substitutions, and changes may be made within the principle and scope of the invention as expressed in the appended claims.

What is claimed is:

1. A method of transforming a readily available preselected optical input pulse of one shape into a preselected output waveform of an arbitrary but defined different shape comprising:
    (a) Providing an array of a plurality of fiber optic waveguides having lengths preselected so that the illumination of one end of the array with said preselected optical input pulse will produce at the other end of said array a chain of optical pulses spaced apart in time in accordance with said preselected lengths, whereby the summation of said chain of pulses will approximate the preselected output waveform,
    (b) Illuminating said one end of the array with said optical input pulse, and
    (c) Combining the outputs of said waveguides at the other end of said array to form a synthesized optical pulse output approximating the preselected shape.

2. The method of claim 1 including the step of converting said synthesized optical pulse output into an electrical pulse.

3. The method of claim 1 wherein said array composes fibers of successively increasing lengths.

4. The method of claim 3, including the step of converting said synthesized optical pulse into an electrical pulse.

5. The method of claim 1 wherein said array includes a plurality of portions, each portion containing one or more fibers of a particular differential length.

6. The method of claim 5, including the step of converting said synthesized optical pulse into an electrical pulse.

7. The method of claim 5, including the step of masking one or more individual fibers from the illuminating pulse.

8. The method of claim 7, including the step of converting said synthesized optical pulse into an electrical pulse.

9. The method of claim 5 wherein said portions are arranged in concentric rings at differential radii from the center of the array and including the step of masking one or more individual fibers from the illuminating pulse.

10. The method of claim 9, including the step of converting said synthesized optical pulse into an electrical pulse.

* * * * *